(12) United States Patent
Tsuji et al.

(10) Patent No.: US 11,955,869 B2
(45) Date of Patent: Apr. 9, 2024

(54) DETECTION DEVICE

(71) Applicant: MIKUNI CORPORATION, Tokyo (JP)

(72) Inventors: Ichiro Tsuji, Kanagawa (JP); Masaki Hiei, Kanagawa (JP)

(73) Assignee: MIKUNI CORPORATION, Tokyo (JP)

( * ) Notice: Subject to any disclaimer, the term of this patent is extended or adjusted under 35 U.S.C. 154(b) by 634 days.

(21) Appl. No.: 17/058,642

(22) PCT Filed: Jul. 13, 2018

(86) PCT No.: PCT/JP2018/026463
§ 371 (c)(1),
(2) Date: Nov. 24, 2020

(87) PCT Pub. No.: WO2020/012631
PCT Pub. Date: Jan. 16, 2020

(65) Prior Publication Data
US 2021/0211013 A1 Jul. 8, 2021

(51) Int. Cl.
*H02K 5/22* (2006.01)
*H02K 11/215* (2016.01)
*H05K 1/11* (2006.01)

(52) U.S. Cl.
CPC ........... *H02K 5/225* (2013.01); *H02K 11/215* (2016.01); *H05K 1/117* (2013.01);
(Continued)

(58) Field of Classification Search
CPC ........ H02K 5/225; H02K 11/20; H02K 11/21; H02K 11/215; H02K 11/225; H05K 1/117;
(Continued)

(56) References Cited

U.S. PATENT DOCUMENTS 7,352,174 B1   4/2008 Lee
2002/0180424 A1  12/2002 Aoki et al.
(Continued)

FOREIGN PATENT DOCUMENTS

CN   202143329      2/2012
CN   202143329 U *  2/2012
(Continued)

OTHER PUBLICATIONS

Voigtland, machine translation of cn202143329, Feb. 2012 (Year: 2012).*
(Continued)

*Primary Examiner* — Eric Johnson
(74) *Attorney, Agent, or Firm* — JCIPRNET

(57) ABSTRACT

A detection device of the present invention is provided with: a housing; a circuit substrate disposed in the housing; a sensor which is electrically connected to the circuit substrate and detects information of an object to be measured; a connector terminal which is formed integrally with the circuit substrate and electrically connected to an external terminal; and a tubular connector which is formed integrally with the housing, surrounds a periphery of the connector terminal, and is fitted in the external connector. Through this configuration, the reduction in the number of components, the reduction in cost and weight, the simplification of structure, and other effects can be achieved.

5 Claims, 14 Drawing Sheets

(52) U.S. Cl.
CPC ............ *H05K 2201/09081* (2013.01); *H05K 2201/1009* (2013.01); *H05K 2201/10151* (2013.01)

(58) Field of Classification Search
CPC . H05K 2201/09081; H05K 2201/1009; H05K 2201/10151
See application file for complete search history.

(56) References Cited

U.S. PATENT DOCUMENTS

| | | | | |
|---|---|---|---|---|
| 2008/0036316 | A1* | 2/2008 | Miyamoto | H02K 11/33 310/71 |
| 2012/0181641 | A1 | 7/2012 | Hiramoto et al. | |
| 2014/0000399 | A1 | 1/2014 | Inoue et al. | |
| 2018/0034345 | A1* | 2/2018 | Hirabayashi | H02K 7/1166 |

FOREIGN PATENT DOCUMENTS

| | | | |
|---|---|---|---|
| DE | 102014216069 | | 2/2016 |
| EP | 1739295 | | 1/2007 |
| JP | H01161583 | | 11/1989 |
| JP | 2002357455 | | 12/2002 |
| JP | 2004112887 | | 4/2004 |
| JP | 2008298591 | | 12/2008 |
| JP | 2008298591 | A * | 12/2008 |
| JP | 2010097715 | | 4/2010 |
| JP | 5298061 | | 9/2013 |
| JP | 2016011843 | | 1/2016 |

OTHER PUBLICATIONS

Miroya et al., Machine Translation of JP2008298591, Dec. 2008 (Year: 2008).*
"Office Action of Japan Counterpart Application", dated Oct. 1, 2021, with English translation thereof, p. 1-p. 10.
"Office Action of Europe Counterpart Application", dated Dec. 19, 2022, p. 1-p. 6.
"International Search Report (Form PCT/ISA/210) of PCT/JP2018/026463," dated Oct. 9, 2018, with English translation thereof, pp. 1-4.
Office Action of China Counterpart Application, with English translation thereof, dated Jan. 26, 2022, pp. 1-18.
Office Action of China Counterpart Application, with English translation thereof, dated Sep. 7, 2022, pp. 1-16.
"Search Report of Europe Counterpart Application", dated Feb. 2, 2022, p. 1-p. 9.

* cited by examiner

DETECTION DEVICE

CROSS-REFERENCE TO RELATED APPLICATION

This application is a 371 application of the International PCT application serial no. PCT/JP2018/026463, filed on Jul. 13, 2018. The entirety of the above-mentioned patent application is hereby incorporated by reference herein and made a part of this specification.

BACKGROUND

Technical Field

The present invention relates to a detection device including a sensor for detecting information of an object to be measured, in particular to a detection device including a sensor for detecting information about a rotation position of a rotation body, a temperature, a flow rate, or a pressure of a fluid, or the like.

Related Art

As a conventional detection device, a rotation angle detection device is disclosed (for example, see patent literature 1) which includes a rotation side conductor attached to a rotation shaft of a rotation body, a fixed side conductor attached to a resin cover, and an electronic circuit for detecting a rotation position of the rotation body.

In the detection device, the resin cover includes a circuit substrate having a detection part which is used as a sensor, a connector which is electrically connected to an external device, a terminal conductor disposed in the connector, and a plurality of copper alloy wiring conductors for connecting a through hole for wiring of the circuit substrate to the terminal conductor.

In the conventional detection device, because the terminal conductor and the plurality of wiring conductors are used, an increase in the number of components, an increase in weight, and the like are caused. In addition, in assembly operations, an operation in which the wiring conductors are connected to the terminal conductor and an operation in which the circuit substrate is connected to the wiring conductors are necessary, and complexity of the assembly operations is caused.

Furthermore, reliability is low in terms of endurance because there are many connection portions.

LITERATURE OF RELATED ART

Patent Literature

Patent Literature 1: Japanese Patent Laid-open No. 5298061

SUMMARY

Problems to be Solved

The present invention provides a detection device which aims to achieve a reduction in the number of components, reduced cost and weight, simplification of structure, and other effects and can solve problems of the conventional technology.

Means to Solve the Problems

The detection device of the present invention includes: a housing; a circuit substrate disposed in the housing; a sensor which is electrically connected to the circuit substrate and detects information of an object to be measured; a connector terminal which is formed integrally with the circuit substrate and electrically connected to an external terminal; and a tubular connector which is formed integrally with the housing, surrounds the periphery of the connector terminal, and is fitted in the external connector.

In the detection device, a configuration may be used in which: the circuit substrate includes a substrate main body formed in a flat-plate shape and a printed wiring arranged on a mounting surface of the substrate main body; and the connector terminal includes an extension plate extending from an edge of the substrate main body, and a terminal wiring which is arranged on the extension plate and forms a part of the printed wiring.

In the detection device, a configuration may be used in which the housing includes a first housing fixing the circuit substrate and a second housing which is coupled to the first housing so as to cover the circuit substrate.

In the detection device, a configuration may be used in which the circuit substrate is fixed to the housing in the vicinity of a base area of the connector terminal.

In the detection device, a configuration may be used in which the housing includes a partition member for partitioning an internal space in which the circuit substrate is disposed and a connector space in which the connector terminal is disposed.

In the detection device, a configuration may be used in which the sensor includes a rotation sensor for detecting a rotation position of the object to be measured.

In the detection device, a configuration may be used in which the detection device includes a rotation shaft which is rotatably supported relative to the housing, and the rotation sensor is disposed to detect the rotation position of the rotation shaft.

In the detection device, a configuration may be used in which the detection device includes a motor which is disposed in the housing in order to exert a rotational driving force on the rotation shaft, and the circuit substrate includes motor terminals to which the motor is electrically connected.

In the detection device, a configuration may be used in which: the circuit substrate includes the substrate main body formed in a flat-plate shape, and the printed wiring arranged on the mounting surface of the substrate main body; the connector terminal includes the extension plate extending from the edge of the substrate main body, and the terminal wiring which is arranged on the extension plate and forms a part of the printed wiring; and the terminal wiring includes a sensor terminal wiring corresponding to the sensor, and a motor terminal wiring corresponding to the motor.

In the detection device, a configuration may be used in which the terminal wiring is arranged on one surface or both surfaces of the extension plate.

In the detection device, a configuration may be used in which an axial line of the motor is disposed parallel to the mounting surface of the circuit substrate, and an axial line of the rotation shaft is disposed perpendicular to the mounting surface of the circuit substrate.

Effect

According to the detection device having the configuration described above, the problems of the conventional technology can be solved, and the reduction in the number of components, the reduction in cost and weight, the simplification of the structure, and other effects can be achieved.

DESCRIPTION OF THE EMBODIMENTS

Hereinafter, an embodiment of the present invention is described with reference to FIGS. 1 to 8 of the accompanying drawings.

Figure 1:
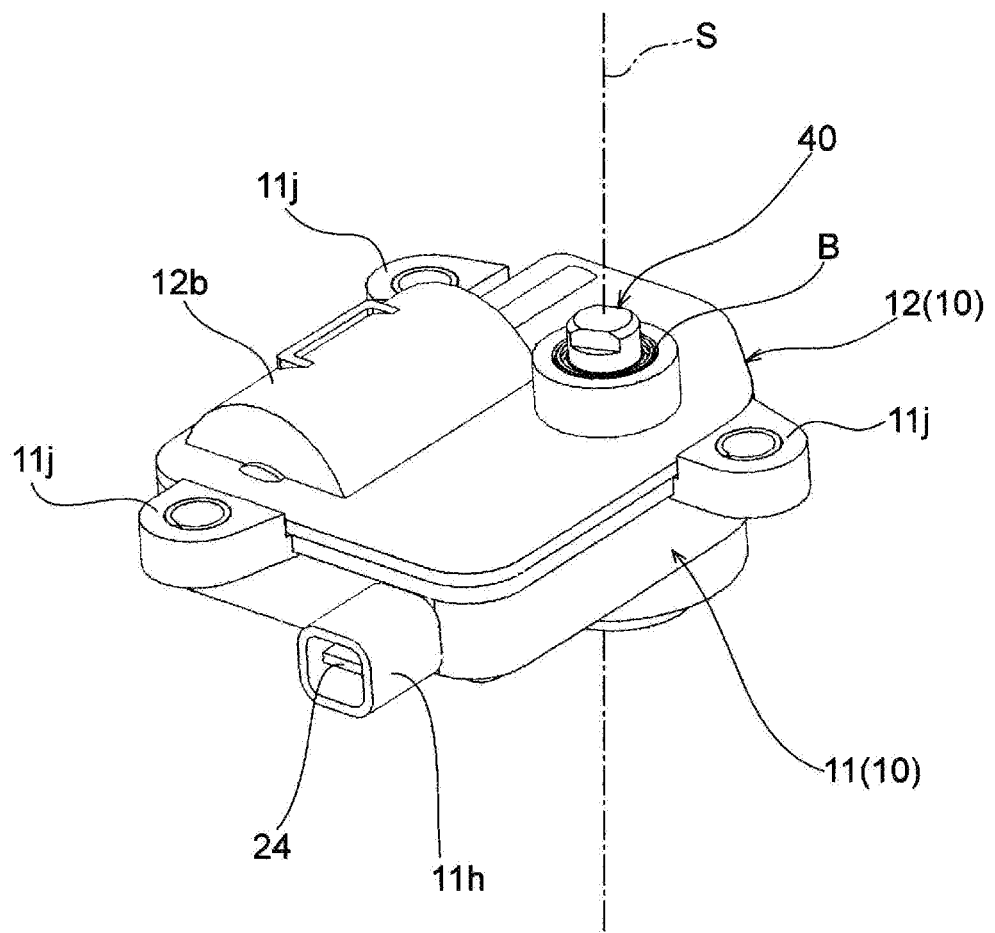
FIG. 1 is an external perspective view showing an embodiment of a detection device according to the present invention.
Figure 2:
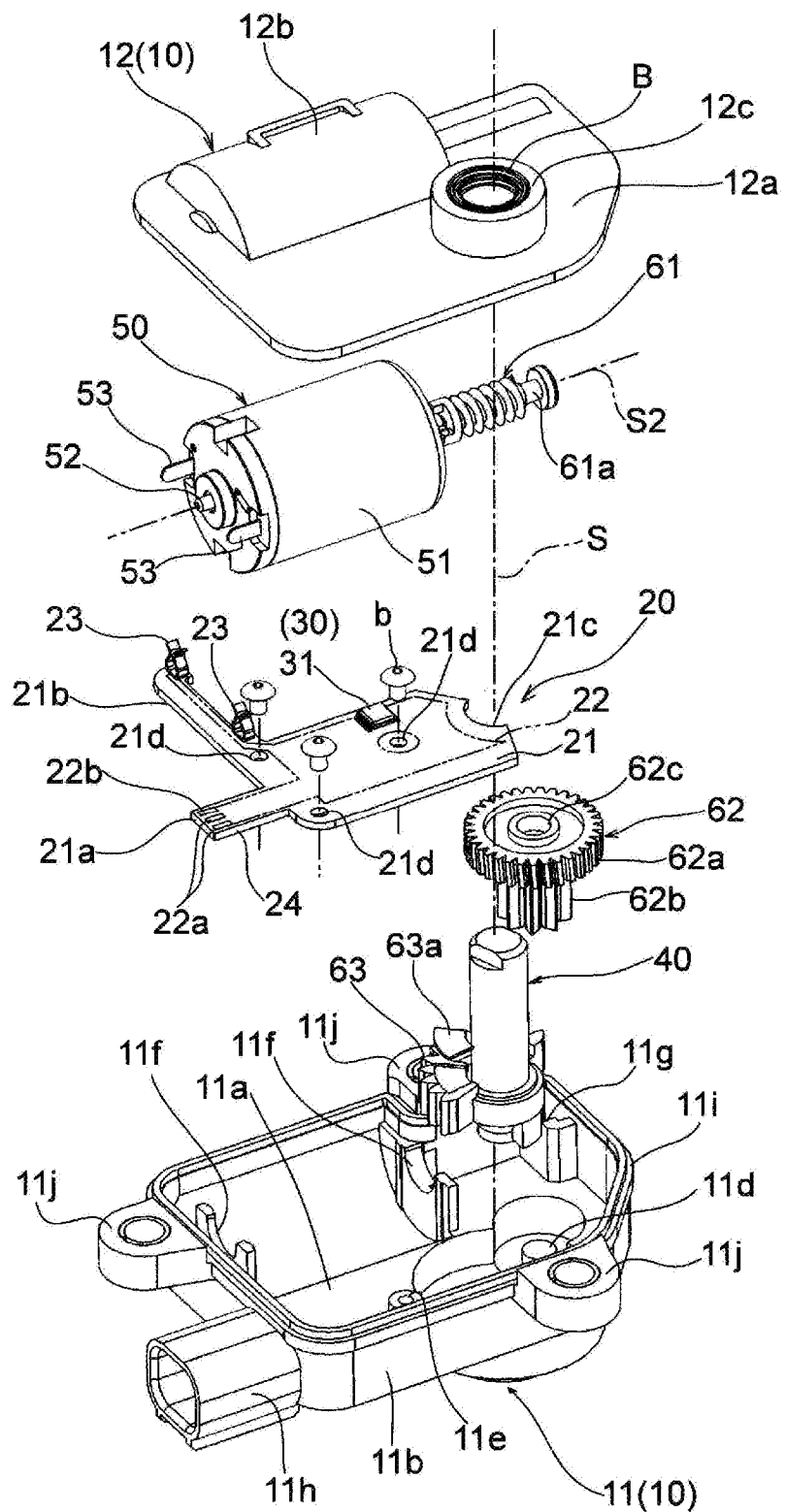
FIG. 2 is an exploded perspective view of the detection device shown in FIG. 1.

As shown in FIG. 1 and FIG. 2, a detection device according to the first embodiment of the present invention includes: a housing 10, a circuit substrate 20 with which a connector terminal 24 integrally formed, a sensor 30 mounted on the circuit substrate 20, a rotation shaft 40, a motor 50, and a speed reduction mechanism 60.

Besides, the detection device according to the first embodiment has a function of detecting a rotation position of the rotation shaft 40, and functions as a drive device or an electric actuator which outputs a rotational driving force of the motor 50 to the outside via the rotation shaft 40.

The housing 10 is formed by a resin material, and consists of a first housing 11 and a second housing 12.

Figure 4:
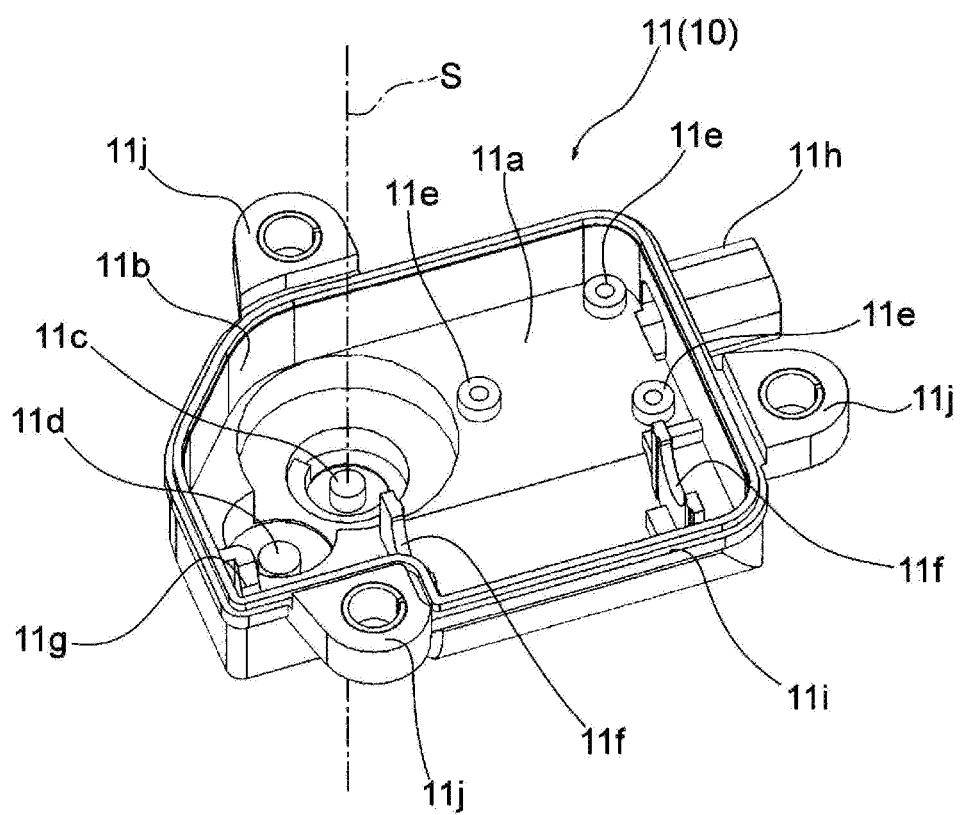
FIG. 4 is a perspective view showing a first housing which forms a part of the detection device shown in FIG. 1.

As shown in FIG. 4, the first housing 11 includes a main wall 11a, a side wall 11b, a pivot shaft 11c, a pivot shaft 11d, three fixing parts 11e, two holding parts 11f, a receiving part 11g, a connector 11h, a coupling part 11i, and three attachment parts 11j.

In order to be fitted in a fitting hole 41 formed on one end side of the rotation shaft 40 and to rotatably support the rotation shaft 40 around a line S, the pivot shaft 11c is formed in a columnar shape.

In order to be fitted in a fitting hole 62c of a two-stage gear 62 and to rotatably support the two-stage gear 62 around an axial line parallel to the axial line S, the pivot shaft 11d is formed in a columnar shape.

In order to fix the circuit substrate 20, the fixing part 11e is formed in a columnar shape and includes a screw hole into which a screw b is screwed.

Besides, the fixing part 11e works together with the screw b which is screwed, and fixes the circuit substrate 20 to the first housing 11.

Here, as shown in FIG. 2 and FIG. 4, in the vicinity of the connector 11h, that is, in an internal space Is surrounded by the side wall 11b, the two fixing parts 11e are disposed on both sides in the vicinity of a base area of the connector terminal 24 on the circuit substrate 20.

In this way, the base area of the connector terminal 24 is securely fixed by the two fixing parts 11e, and thus vibration intensity and the like can be increased.

In order to make the motor 50 embedded and to work together with a holding part 12f of the second housing 12 to fix the motor 50, a holding part 11f is formed in a concave shape.

In order to receive a front end part 61a of a worm 61 which is coupled to the motor 50, and to work together with a pressing part 12g of the second housing 12 to rotatably support the front end part 61a, the receiving part 11g is formed in a concave shape.

The connector 11h protrudes from the side wall 11b and is formed in a tubular shape in a direction parallel to a mounting surface of the circuit substrate 20 and parallel to an axial line S2 of the motor 50.

Besides, the connector 11h is formed so as to define a connector space Cs surrounding the periphery of the connector terminal 24, and to be fitted in a female external connector.

In order to be coupled to a coupling part 12i of the second housing 12, the coupling part 11i includes an annular convex part.

In order to be fixed to an object to be attached by using a screw or the like, an attachment part 11j is formed in a shape protruding from the side wall 11b and includes a through hole through which the screw or the like passes.

Figure 5:
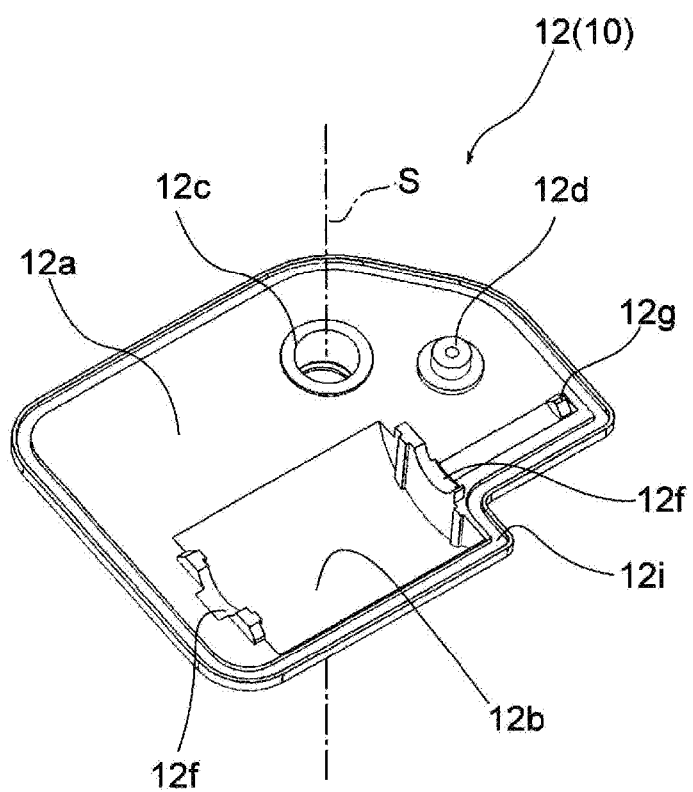
FIG. 5 is a perspective view showing a second housing which forms a part of the detection device shown in FIG. 1.

As shown in FIG. 5, the second housing 12 includes a main wall 12a, a curved part 12b, a bearing part 12c, a pivot shaft 12d, two holding parts 12f, the pressing part 12g, and the coupling part 12i.

The curved part 12b is formed in a manner of being curved outward in a convex shape so as to define a concave part for receiving a part of the motor 50.

The bearing part 12c defines a through hole exposed to the outside through the rotation shaft 40 and includes a bearing B which rotatably supports the rotation shaft 40.

The bearing B is, for example, a rubber seal member, and works together with the pivot shaft 11c to rotatably support the rotation shaft 40 around the axial line S.

In order to be fitted in the fitting hole 62c of the two-stage gear 62, and to work together with the pivot shaft 11d to rotatably support the two-stage gear 62 around an axial line parallel to the axial line S, the pivot shaft 12d is formed in a columnar shape.

In order to make the motor 50 embedded and to work together with the holding part 11f of the first housing 11 to fix the motor 50, the holding part 12f is formed in a concave shape.

That is, the holding part 12f plays a role in fixing the motor 50 in the housing 10 by working together with the holding part 11f to sandwich the motor 50.

The pressing part 12g is formed so as to rotatably press the front end part 61a of the worm 61 supported by the receiving part 11g toward the receiving part 11g.

In order to be coupled to the coupling part 11i of the first housing 11, the coupling part 12i includes an annular concave part. Here, coupling of the coupling part 12i and the coupling part 11i is performed by fitting the convex part of the coupling part 11i with the concave part of the coupling part 12i and by welding.

As described above, according to the housing 10 which consists of the first housing 11 and the second housing 12, the circuit substrate 20 is fixed to the first housing 11, the second housing 12 is coupled to the first housing 11 so as to cover the circuit substrate 20, and thereby the internal space Is is defined in which the circuit substrate 20 is disposed.

Here, the internal space Is is formed in a manner of communicating with the connector space Cs which is defined by the connector 11h.

In addition, the housing 10 has a dual partitioning structure which consists of the first housing and the second housing, and thus, assembly of the circuit substrate 20 can become easy, and an operation of arranging the connector terminal 24 in the connector 11h can also be easily performed.

Figure 6:
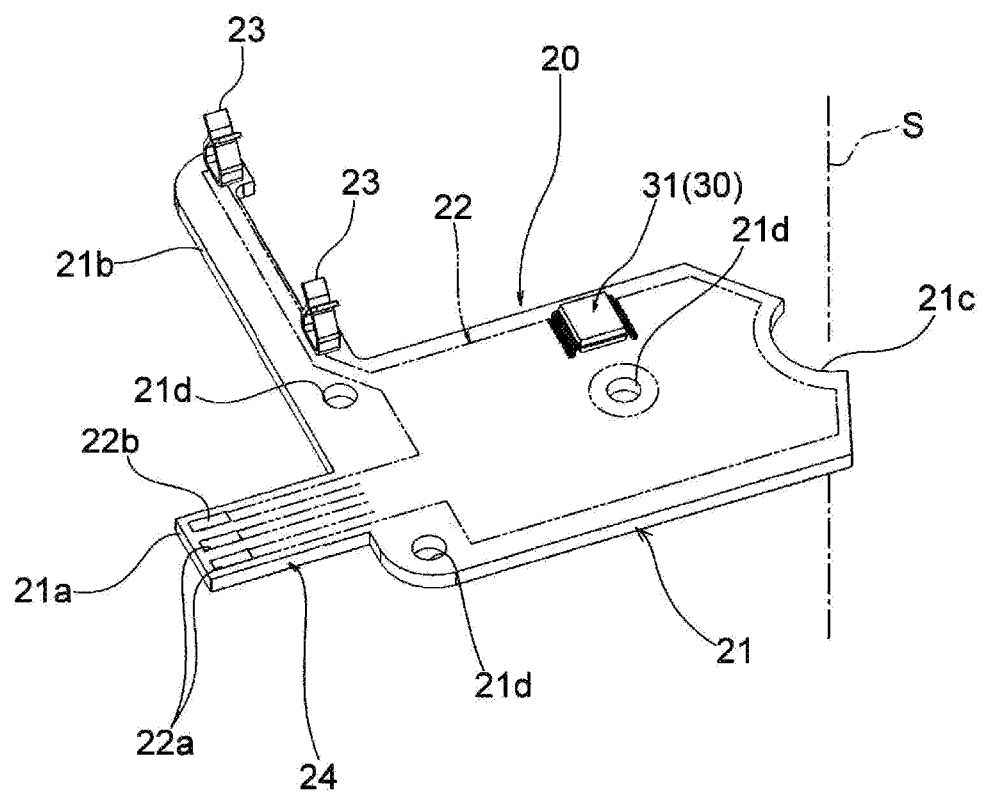
FIG. 6 is a perspective view showing a circuit substrate which forms a part of the detection device shown in FIG. 1.
Figure 7:
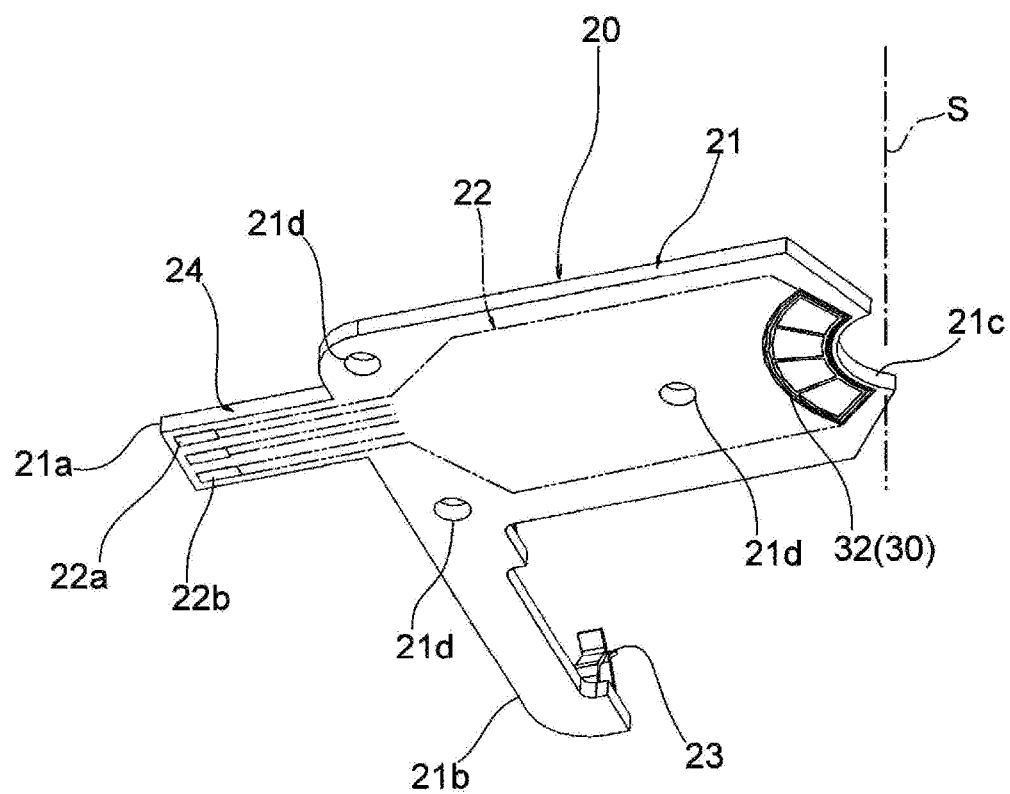
FIG. 7 is a perspective view showing the circuit substrate which forms a part of the detection device shown in FIG. 1.

As shown in FIG. 6 and FIG. 7, the circuit substrate 20 includes a substrate main body 21 formed in a flat-plate shape, a printed wiring area 22 showing an outer contour of a printed wiring (not shown) arranged on the mounting surface of the substrate main body 21, two motor terminals 23 fixed to the substrate main body 21, and the connector terminal 24 electrically connected to an external terminal.

The two motor terminals 23 are connected to the printed wiring of the printed wiring area 22.

Besides, on the circuit substrate 20, the sensor 30 and the other electronic components (not shown) are mounted.

The substrate main body 21 is a rigid flat plate using an insulation body as a base material, one surface or both surfaces of the substrate main body 21 function as the mounting surface, and the substrate main body 21 includes an extension plate 21a and an arm part 21b integrally formed in a manner of extending from an edge of the substrate main body 21.

In addition, on the substrate main body 21, an arc part 21c which faces the rotation shaft 40 and three circular holes 21d through which the screw b passes are formed.

The extension plate 21a is formed in a manner of extending toward the connector space Cs of the connector 11h, and holds, on both surfaces, a terminal wiring electrically connected to a female external terminal.

In the internal space Is of the housing 10, the arm part 21b is formed in a manner of elongating in a direction perpendicular to the extension plate 21a, and holds the motor terminals 23 to which pin terminals 53 of the motor 50 are electrically connected.

The printed wiring area 22 is an area including the printed wiring (not shown) which is printed on the substrate main body 21. The printed wiring is formed in a manner of being arranged corresponding to the mounted electronic components, and including a sensor terminal wiring 22a corresponding to the sensor 30 and a motor terminal wiring 22b corresponding to the motor 50.

The sensor terminal wiring 22a is connected to a sensor element 31 via the printed wiring.

The motor terminal wiring 22b is connected to the motor terminal 23 via the printed wiring.

Here, the sensor terminal wiring 22a is formed by two terminals arranged on one surface of the extension plate 21a and one terminal arranged on the other surface of the extension plate 21a, and the motor terminal wiring 22b is formed by one terminal arranged on each surface of the extension plate 21a.

That is, the sensor terminal wiring 22a includes three terminals for a ground voltage, a supply voltage, and a sensor output voltage. The motor terminal wiring 22b includes two terminals for the ground voltage and the supply voltage.

In this way, the terminal wiring is arranged on both sides of the extension plate 21a, and thus, compared with a case where the terminal wiring is arranged on only one side of the extension plate 21a, a width of the extension plate 21a can be narrowed, and the connector 11h integrally formed on the housing 10 can be miniaturized.

Moreover, the sensor terminal wiring 22a and the motor terminal wiring 22b may be arranged on one surface of the extension plate 21a, or the sensor terminal wiring 22a may be arranged on one surface of the extension plate 21a and the motor terminal wiring 22b may be arranged on the other surface of the extension plate 21a.

In order to supply electrical power to the motor 50, the motor terminal 23 is formed in a manner of sandwiching the pin terminal 53 of the motor 50 and being electrically connected to the pin terminal 53, and is connected to the printed wiring which is included in the printed wiring area 22 on the circuit substrate 20. In addition, the motor terminal 23 is connected to the sensor terminal wiring 22a via the printed wiring.

That is, the connector terminal 24, which is integrally formed on the circuit substrate 20 and is electrically connected to a female external terminal, is configured by the extension plate 21a extending from the edge of the substrate main body 21 and by the sensor terminal wiring 22a and the motor terminal wiring 22b which are a part of the printed wiring.

In a state of assembly in which the connector terminal 24 is disposed in the connector 11h of the housing 10, the connector terminal 24 elongates perpendicular to the axial line S of the rotation shaft 40 and parallel to the axial line S2 of the motor 50, and the periphery of the connector terminal 24 is surrounded by the connector 11h.

In addition, with respect to the circuit substrate 20, the screw b passes through the circular hole 21d and is screwed into the fixing part 11e, and thereby on both sides in the vicinity of the base area of the connector terminal 24, the circuit substrate 20 is fixed to the first housing 11, that is, the housing 10.

Thus, vibration of the connector terminal 24 which has a cantilever-like shape can be prevented or suppressed.

Figure 3:
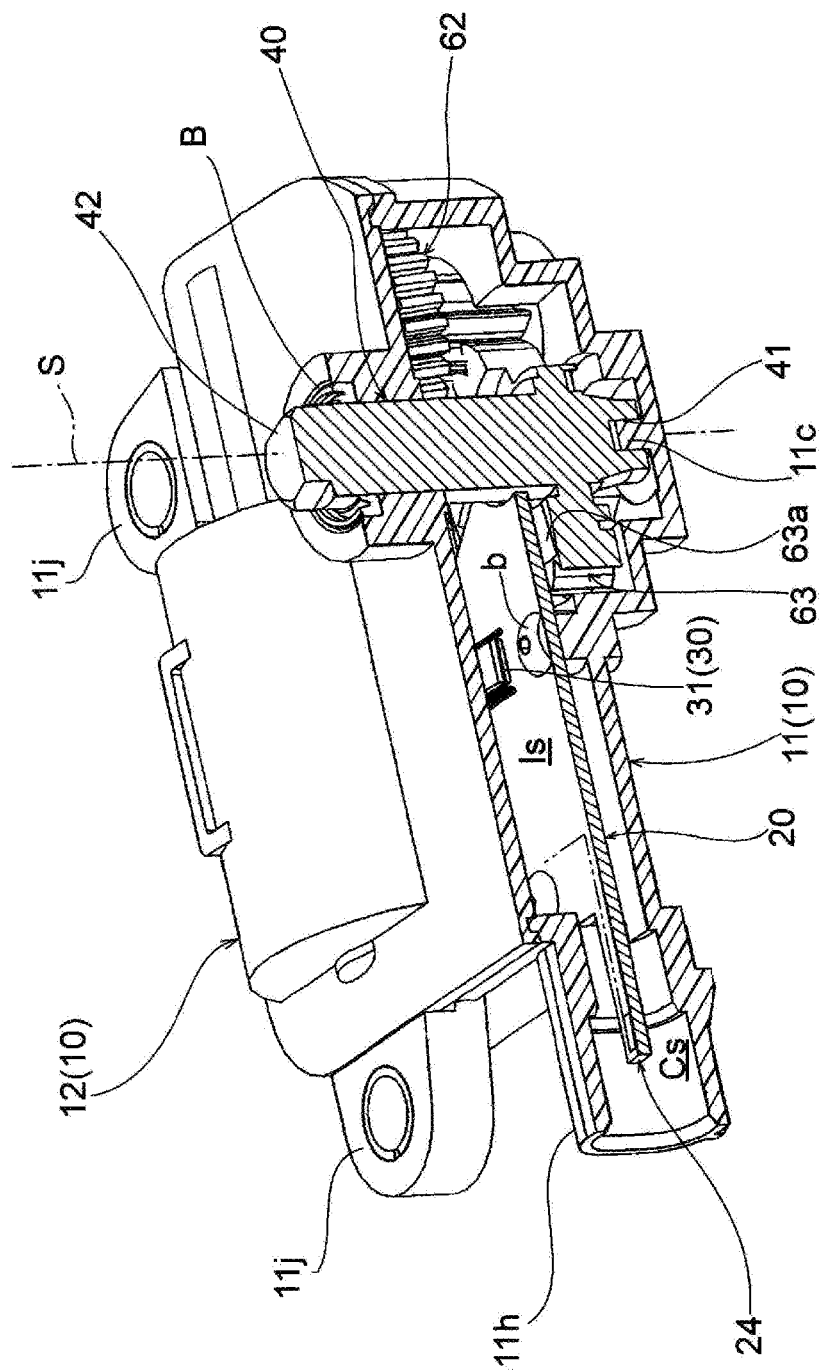
FIG. 3 is a perspective cross sectional view which is obtained by cutting a part of the detection device shown in FIG. 1.

As shown in FIG. 3 and FIG. 7, the sensor 30 includes the sensor element 31 mounted on the circuit substrate 20, and a sensor coil wiring 32 which is disposed facing a metal target 63a of a gear 63.

The sensor element 31 is connected to the sensor terminal wiring 22a via the printed wiring.

The sensor coil wiring 32 is connected to the sensor element 31 via the printed wiring.

Besides, the sensor 30 works together with the metal target 63a which is fixed to the gear 63 integrally rotating with the rotation shaft 40, functions as a noncontact inductive sensor for detecting a change of inductance based on a principle of mutual induction, and detects the rotation position of the rotation shaft 40.

The rotation shaft 40 is formed in a columnar shape using a metal material or the like, and includes the fitting hole 41 which is fitted with the pivot shaft 11c on one end of the rotation shaft 40, and a linking part 42 links a rotated member on which an external rotational driving force is exerted on the other end of the rotation shaft 40.

The linking part 42 is formed as a convex fitting part having two surfaces parallel to each other, and can removably links the rotated member.

Besides, the pivot shaft 11c is fitted in the fitting hole 41, the other end side of the rotation shaft 40 is fitted in the bearing B of the bearing part 12c so as to expose the linking part 42 to the outside, and thereby the rotation shaft 40 is supported to rotate freely relative to the housing 10 around the axial line S.

The motor 50 is a DC motor, and includes a cylindrical main body 51, a drive shaft 52 having the axial line S2, and the pin terminal 53 extending from the main body 51.

The main body 51 is disposed and fixed in the housing 10 by being sandwiched by the holding part 11f of the first housing 11 and the holding part 12f of the second housing 12.

In a state in which the motor 50 is assembled, the axial line S2 of the drive shaft 52 is disposed parallel to the mounting surface of the circuit substrate 20, and is disposed perpendicular to the axial line S of the rotation shaft 40.

The worm 61 which forms a part of the speed reduction mechanism 60 is fitted and fixed to the drive shaft 52.

The pin terminal 53 is electrically connected to the motor terminal 23 arranged on the circuit substrate 20.

Figure 8:
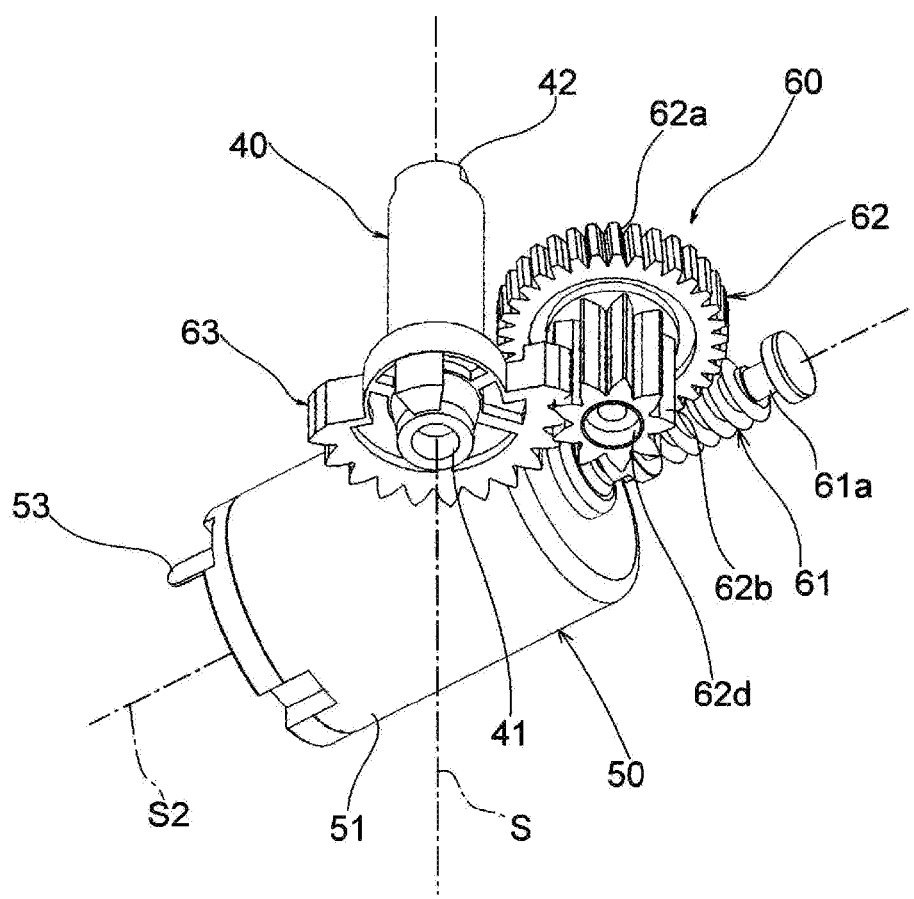
FIG. 8 is a perspective view showing a rotation shaft, a motor and a speed reduction mechanism included in the detection device shown in FIG. 1.

As shown in FIG. 8, the speed reduction mechanism 60 includes the worm 61, the two-stage gear 62, and the gear 63 which is fixed to the rotation shaft 40.

In order to integrally rotate with the drive shaft 52 of the motor 50, the worm 61 is fitted in and held by the drive shaft 52, and is rotatably held by the receiving part 11g of the first housing 11 and the pressing part 12g of the second housing 12.

The two-stage gear 62 includes: a large diameter gear 62a which meshes with the worm 61, a small diameter gear 62b which is disposed coaxially with the large diameter gear 62a and meshes with the gear 63, and fitting holes 62c and 62d.

Besides, the pivot shaft 11d of the first housing 11 is fitted in the fitting hole 62d, the pivot shaft 12d of the second housing 12 is fitted in the fitting hole 62c, and thereby the two-stage gear 62 is rotatably supported relative to the housing 10 around the axial line parallel to the axial line S.

The gear 63 is integrally formed with the rotation shaft 40, and is rotatably supported relative to the housing 10 around the axial line S in a state of meshing with the small diameter gear 62b of the two-stage gear 62.

In addition, the metal target 63a is embedded and fixed to the gear 63 on a side surface facing the sensor coil wiring 32 of the circuit substrate 20.

According to the speed reduction mechanism 60, the rotational driving force of the motor 50 is transferred to the rotation shaft 40 via the worm 61, the two-stage gear 62, and the gear 63.

In this way, by arranging the speed reduction mechanism 60, the rotational driving force can be reduced to a desired speed and transferred to an external rotated member.

According to the detection device having the configuration described above, the connector terminal 24 is integrally formed on the circuit substrate 20 as a part of the circuit substrate 20, and thus a conventional terminal conductor and a conventional wiring conductor are not required, and the reduction in the number of components, the reduction in cost and weight, the simplification of structure, and other effects can be achieved.

In particular, the terminal wiring of the connector terminal 24, that is, the sensor terminal wiring 22a and the motor terminal wiring 22b are formed as a part of the printed wiring, and thus the terminal wiring can be formed by printing at the same time as the wiring of the mounted electronic components, and a manufacturing process can be simplified.

In addition, electrical connection corresponding to the sensor 30 and the motor 50 can be performed by one connector terminal 24, and thus the simplification and miniaturization of structure and the like can be achieved compared with a case where the connector terminals are separately arranged.

In addition, in the detection device, the rotation shaft 40, which can be linked to the external rotated member and includes the gear 63 to which the metal target 63a is fixed, is previously incorporated into the housing 10, and thus an assembly precision for detection can be improved compared with a case where only the sensor 30 is incorporated.

In addition, in the detection device, the motor 50 is included, and thus, in addition to the detection function of detecting the rotation position of the rotation shaft 40, the detection device can have a function of being used as a drive device or an electromagnetic actuator which outputs the rotational driving force to the outside via the rotation shaft 40.

Furthermore, in the detection device, the axial line S2 of the motor 50 is disposed parallel to the mounting surface of the circuit substrate 20, and the axial line S of the rotation shaft 40 is disposed perpendicular to the mounting surface of the circuit substrate 20, and thus thinness, the miniaturization and the like of the housing 10, that is, the detection device can be achieved in a direction of the axial line S of the rotation shaft 40.

In particular, when the detection device is assembled to a different device in order to exert the rotational driving force to the rotated member, the thinness and the miniaturization of the entire device can be achieved.

Next, assembly operations of the detection device having the configuration describe above are described.

First, the first housing 11, the second housing 12 into which the bearing B is incorporated, the circuit substrate 20 on which the sensor 30 is mounted, the rotation shaft 40 integrally including the gear 63 to which the metal target 63a is fixed, the motor 50 to which the worm 61 is coupled, and the two-stage gear 62 are prepared.

First, the rotation shaft 40 is assembled to the pivot shaft 11c of the first housing 11. Then, the circuit substrate 20 is fixed to the first housing 11. That is, in a way that the connector terminal 24 passes through an inner side of the connector 11h, the circuit substrate 20 is abutted on the fixing part 11e of the first housing 11, and the screw b passes through the circular hole 21d and is screwed into the screw hole of the fixing part 11e. Thereby, the circuit substrate 20 is securely fixed to the first housing 11.

Next, the worm 61 is assembled to the motor 50, and then, the motor 50 and the worm 61 are assembled to the first housing 11. That is, the main body 51 is embedded to the holding part 11f of the first housing 11, the front end part 61a of the worm 61 is embedded to the receiving part 11g, and the pin terminal 53 is embedded and electrically connected to the motor terminal 23 on the circuit substrate 20.

Then, the two-stage gear 62 is assembled to the pivot shaft 11d of the first housing 11.

Then, the second housing 12 into which the bearing B is incorporated is coupled to the first housing 11. That is, the rotation shaft 40 passes through the bearing part 12c and the bearing B, the pivot shaft 12d is fitted in the fitting hole 62c of the two-stage gear 62, the holding part 12f is abutted on the main body 51 of the motor 50, and the pressing part 12g is abutted on the front end part 61a of the worm 61.

Besides, the coupling part 12i is fitted in the coupling part 11i, and the second housing 12 is coupled to the first housing 11 by the welding. Moreover, the coupling of the second housing 12 and the first housing 11 is not limited to the welding, and bonding and the other coupling methods may also be used.

In this way, in the assembly operations of the detection device, an operation of setting the connector terminal 24 in the connector 11h is performed at the same time as an assembly operation of the circuit substrate 20, and thus, a conventional connection operation of exclusive components and the like are no longer required, and the assembly operations are simplified. In addition, there are less connection portions than the conventional structure, and thus the reliability is also improved.

Figure 9:
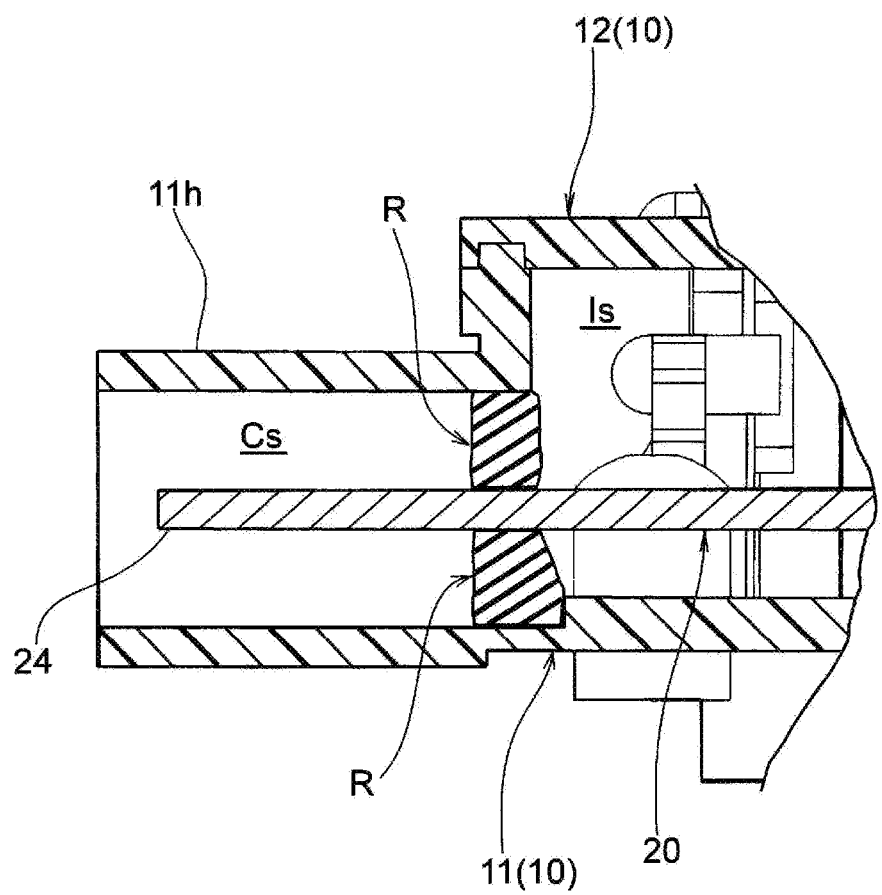
FIG. 9 is a partial sectional view showing a variation example in which an encapsulation resin is used as a partition member for partitioning a connector space and an internal space in the detection device shown in FIG. 1.

FIG. 9 is a drawing showing a variation example of the detection device according to the first embodiment, and a configuration in FIG. 9 is the same as the configuration described above except that an encapsulation resin is arranged serving as a partition member. Thus, the same configurations are marked with the same signs, and repeated descriptions are omitted. In the detection device according to the variation example, as shown in FIG. 9, an encapsulation resin R which is used as the partition member is arranged.

In the housing 10, the encapsulation resin R is arranged so as to partition the internal space Is in which the circuit substrate 20 is disposed and the connector space Cs in which the connector terminal 24 is disposed.

When the circuit substrate 20 is incorporated into the first housing 11, the encapsulation resin R is injected and hardened along the side wall 11b in the base area of the connector 11h in a state that the connector terminal 24 is inserted in the connector 11h.

Accordingly, the connector space Cs in which the connector terminal 24 is disposed is shielded from the internal space Is of the housing 10 by the encapsulation resin R, and thus a sealing performance, a waterproofing property, and the like of the internal space Is can be improved.

In addition, the base area of the connector terminal 24 is securely supported by the encapsulation resin R, and thus the vibration intensity and the like can be further improved.

Figure 10:
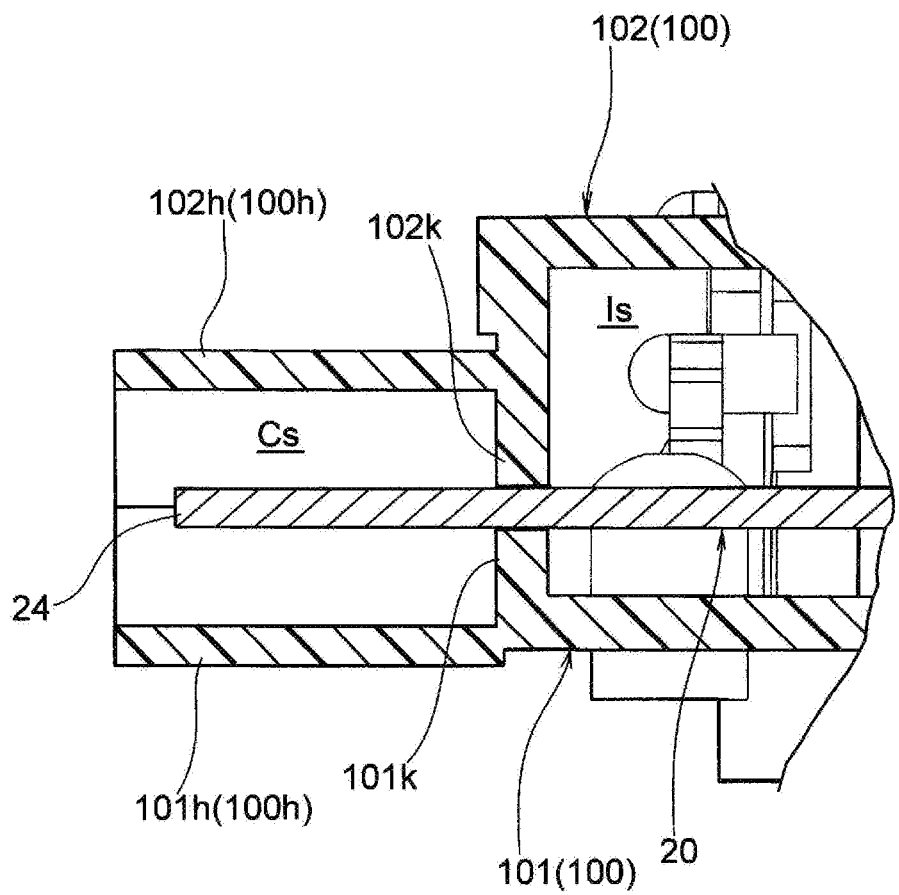
FIG. 10 is a partial sectional view showing another embodiment in which a partition wall formed integrally with a housing is used as the partition member for partitioning the connector space and the internal space in the detection device shown in FIG. 1.

FIG. 10 is a drawing showing the second embodiment of the detection device according to the present invention, and is the same as the first embodiment except that a partition wall which is used as the partition member is arranged and a division position of the first housing and the second housing by which the housing is configured is changed. Thus, the same configurations are marked with the same signs, and repeated descriptions are omitted.

In the detection device according to the embodiment, as shown in FIG. 10, a housing 100 consists of a first housing 101 and a second housing 102.

The first housing 101 includes the main wall 11a, the side wall 11b, the pivot shaft 11c, the pivot shaft 11d, the three fixing parts 11e, the two holding parts 11f, the receiving part 11g, a connector half body 101h, the coupling part 11i, the three attachment parts 11j, and a partition wall 101k.

The second housing 102 includes the main wall 12a, the curved part 12b, the bearing part 12c, the pivot shaft 12d, the two holding parts 12f, the pressing part 12g, a connector half body 102h, the coupling part 12i, and a partition wall 102k.

The second housing 102 is welded and coupled to the first housing 101, and thereby the connector half bodies 101h and 102h are formed so as to define a connector 100h.

In the housing 100, the partition walls 101k and 102k are arranged so as to partition the internal space Is in which the circuit substrate 20 is disposed and the connector space Cs in which the connector terminal 24 is disposed.

That is, when the circuit substrate 20 is incorporated into the housing 100, the circuit substrate 20 is incorporated into the first housing 101, the connector terminal 24 is disposed on the inner side of the connector half body 101h, and the second housing 102 is welded and coupled to the first housing 101 in a way of making the connector half body 102h face the connector half body 101h.

Thereby, the connector terminal 24 is disposed in the connector space Cs of the connector 100h. In addition, the partition walls 101k and 102k come into a state of clamping the base area of the connector terminal 24 and partitioning the internal space Is in which the circuit substrate 20 is disposed and the connector space Cs in which the connector terminal 24 is disposed.

In this way, the connector space Cs in which the connector terminal 24 is disposed is shielded from the internal space Is of the housing 100 by the partition walls 101k and 102k, and thus the sealing performance, the waterproofing property, and the like of the internal space Is can be improved.

In addition, the base area of the connector terminal 24 is securely clamped by the partition walls 101k and 102k, and thus the vibration intensity and the like can be further improved.

In order to further improve the sealing performance and the waterproofing property, a contact area of the connector terminal 24 and the partition walls 101k and 102k may be filled by a resin.

Moreover, in the embodiment, the division position of the first housing 101 and the second housing 102 is not limited to a position shown in FIG. 10, and the first housing 101 and the second housing 102 may be divided in any position between the connector half body 101h and the connector half body 102h.

Figure 11:
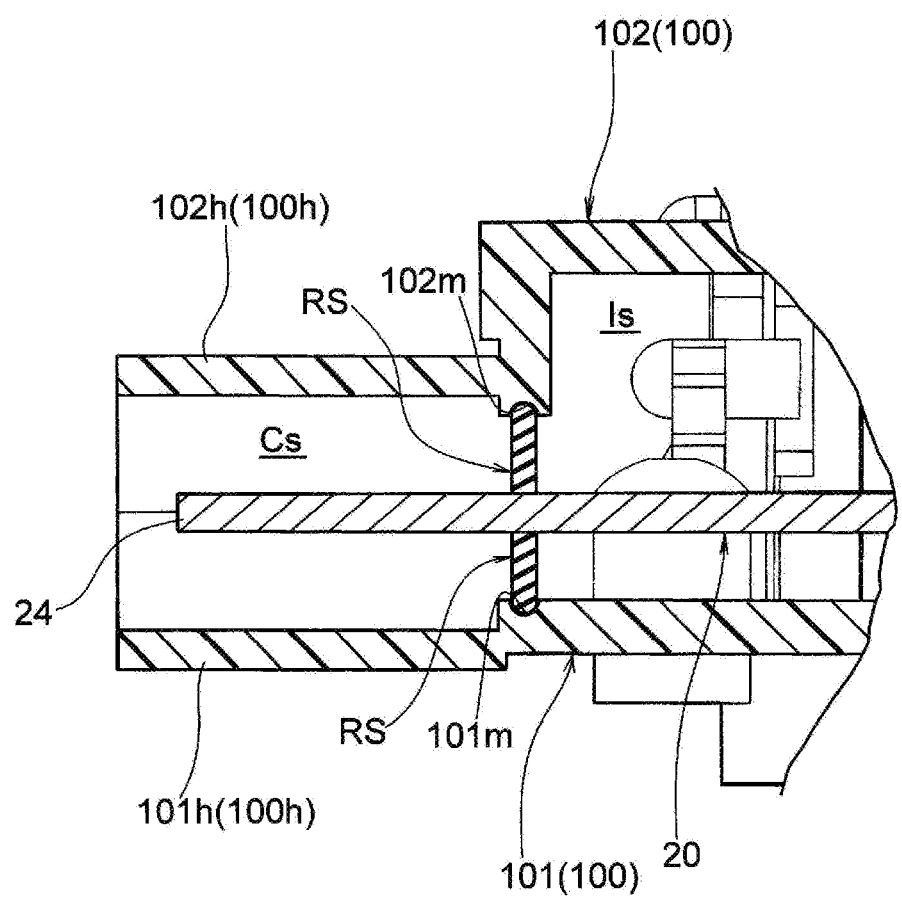
FIG. 11 is a partial sectional view showing still another embodiment in which a flexible resin seal which is integrally molded is used as the partition member for partitioning the connector space and the internal space in the detection device shown in FIG. 1.

FIG. 11 is a drawing showing a variation example of the second embodiment shown in FIG. 10, and is the same as the second embodiment except that the partition wall which is used as the partition member is changed to a fitting groove and a flexible resin seal. Thus, the same configurations are marked with the same signs, and repeated descriptions are omitted. In the detection device according to the variation example, as shown in FIG. 11, a flexible resin seal RS is arranged as the partition member.

The first housing 101 includes the main wall 11a, the side wall 11b, the pivot shaft 11c, the pivot shaft 11d, the three fixing parts 11e, the two holding parts 11f, the receiving part 11g, the connector half body 101h, the coupling part 11i, the three attachment parts 11j, and a fitting groove 101m.

The second housing 102 includes the main wall 12a, the curved part 12b, the bearing part 12c, the pivot shaft 12d, the two holding parts 12f, the pressing part 12g, the connector half body 102h, the coupling part 12i, and a fitting groove 102m.

The flexible resin seal RS is integrally molded on the circuit substrate 20 in advance in a substantially rectangular annular shape surrounding the connector terminal 24.

That is, when the circuit substrate 20 is incorporated into the housing 100, the circuit substrate 20 is incorporated into the first housing 101, the flexible resin seal RS is embedded to the fitting groove 101m and the connector terminal 24 is disposed on the inner side of the connector half body 101h, and the second housing 102 is welded and coupled to the first housing 101 in a way of making the flexible resin seal RS embedded to the fitting groove 102m and making the connector half body 102h face the connector half body 101h.

Thereby, the connector terminal 24 is disposed in the connector space Cs of the connector 100h. In addition, the flexible resin seal RS becomes a state of clamping the base area of the connector terminal 24 and partitioning the internal space Is in which the circuit substrate 20 is disposed and the connector space Cs in which the connector terminal 24 is disposed.

In this way, the connector space Cs in which the connector terminal 24 is disposed is shielded from the internal space Is of the housing 100 by the flexible resin seal RS, and thus the sealing performance, the waterproofing property, and the like of the internal space Is can be improved.

In addition, the base area of the connector terminal 24 is held by the flexible resin seal RS, and thus a vibration-proof effect and the like can be achieved.

Moreover, in the variation example, the division position between the first housing 101 and the second housing 102 is not limited to the position shown in FIG. 11, and the first housing 101 and the second housing 102 may be divided in any position between the connector half body 101h and the connector half body 102h.

Figure 12:
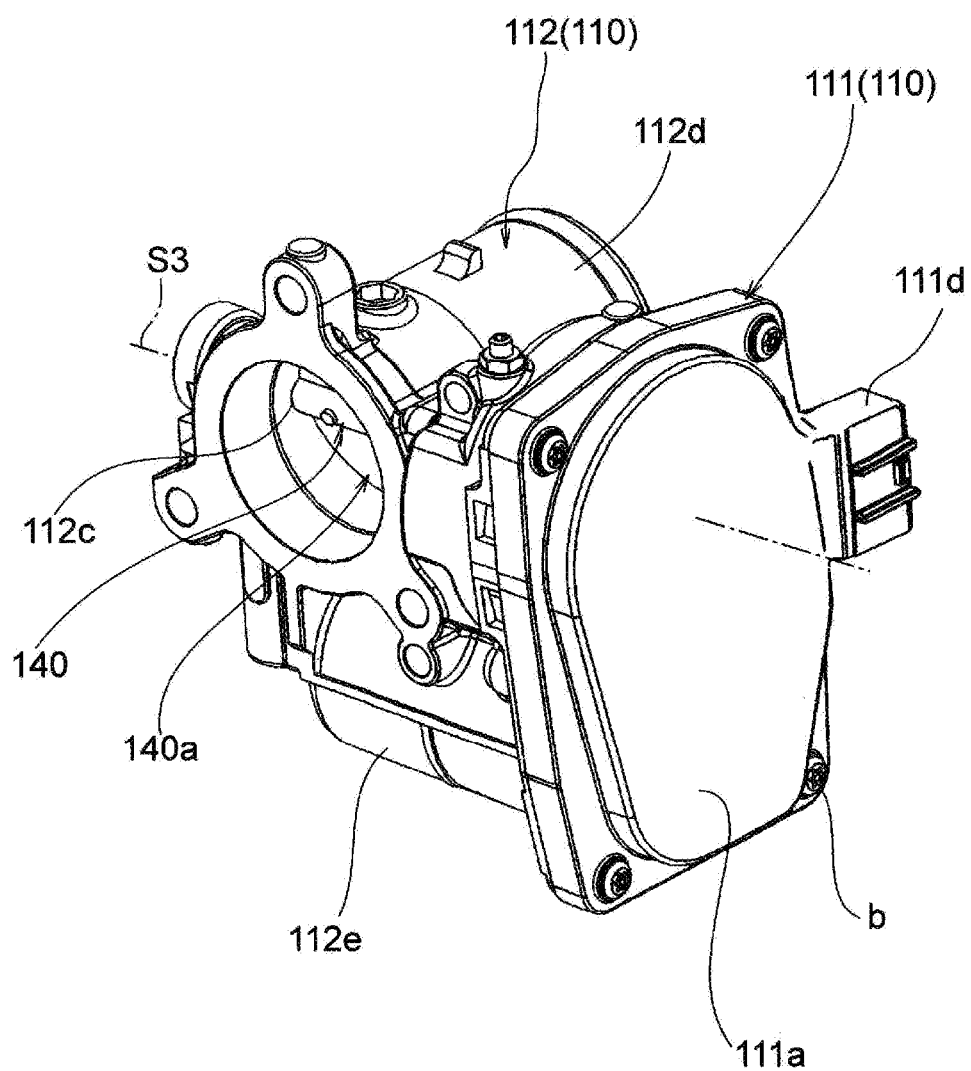
FIG. 12 is an external perspective view showing the still another embodiment of the detection device according to the present invention.
Figure 13:
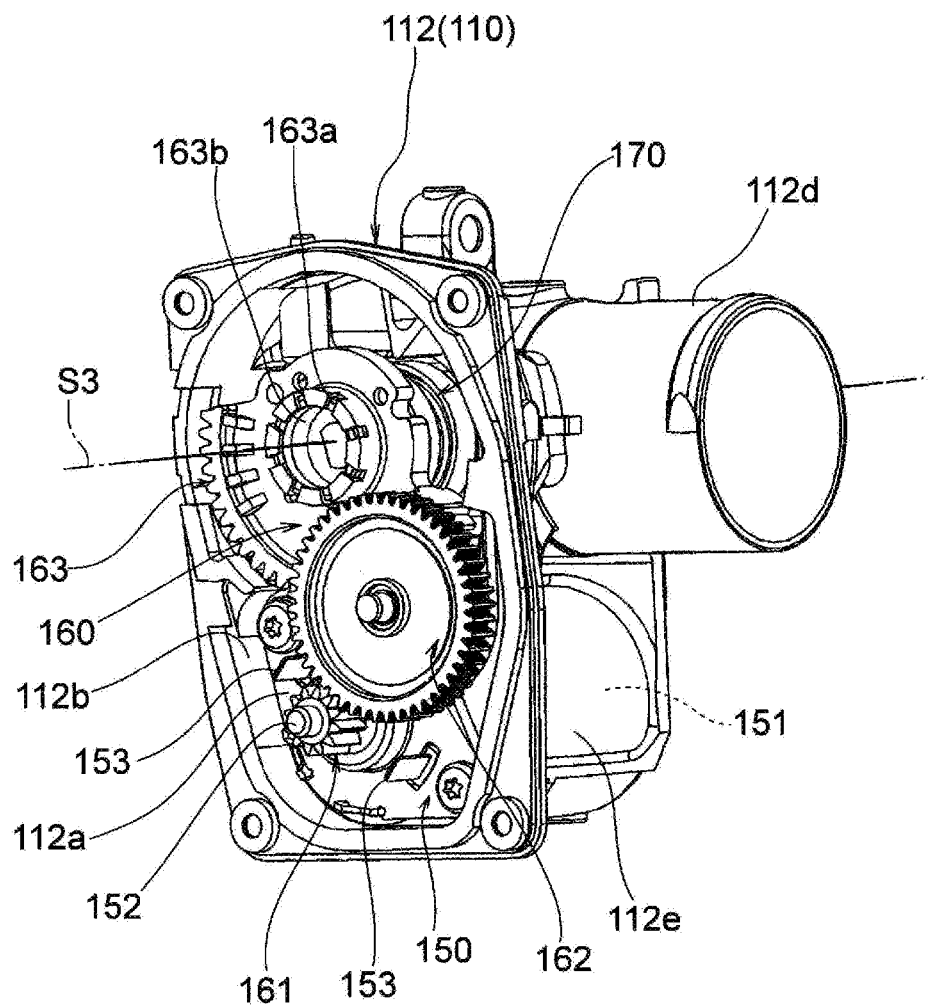
FIG. 13 is a perspective view showing a state in which the first housing is removed in the detection device shown in FIG. 12.
Figure 14:
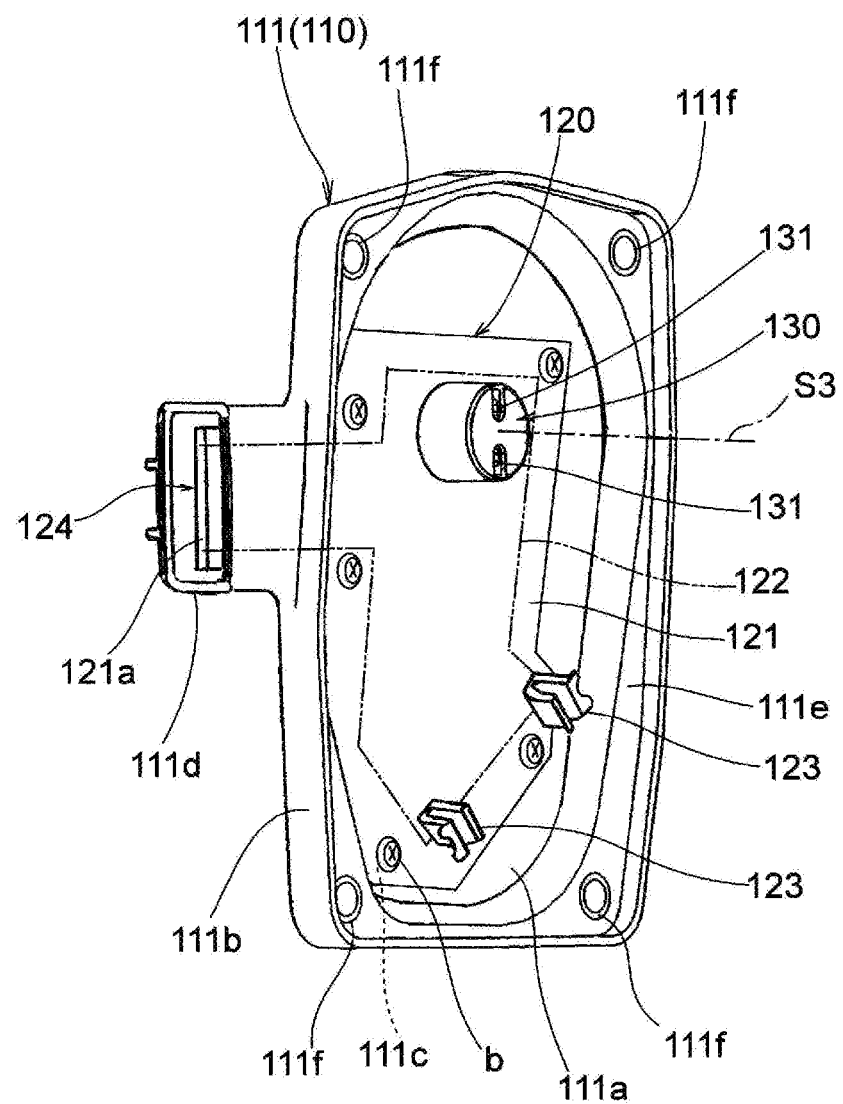
FIG. 14 is a perspective view showing the first housing, the circuit substrate, and a sensor of the detection device shown in FIG. 12.

FIG. 12 to FIG. 14 are drawings showing a third embodiment of the detection device according to the present invention.

A detection device according to the embodiment is, as shown in FIG. 12 to FIG. 14, a device which is incorporated as a part of a throttle device.

The throttle device includes a housing 110, a circuit substrate 120, a sensor 130 mounted on the circuit substrate 120, a throttle shaft 140 which opens and closes a throttle valve 140a, a motor 150, a speed reduction mechanism 160, and a default mechanism 170.

Besides, in the throttle device which adjusts a rate of flow of intake air passing through an intake air passage, the detection device according to the third embodiment detects a degree of opening of the throttle valve 140a by detecting the rotation position of the throttle shaft 140 around an axial line S3.

The housing 110 is formed by an aluminum material and consists of a cover 111 used as the first housing and a throttle body 112 used as the second housing.

As shown in FIG. 14, the cover 111 includes a main wall 111a, a side wall 111b, a fixing part 111c which fixes the circuit substrate 120, a connector 111d, a coupling part 111e, and four circular holes 111f through which the screw passes.

The throttle body 112 includes a main wall 112a, a side wall 112b, a bearing hole 112c which rotatably supports the throttle shaft 140, a tubular part 112d which defines the intake air passage, and a motor accommodation part 112e.

The circuit substrate 120 includes a substrate main body 121 formed in a flat-plate shape, a printed wiring area 122 which defines an outer contour of the printed wiring arranged on the mounting surface of the substrate main body 121, two motor terminals 123 which are fixed to the substrate main body 121 and electrically connected to the printed wiring, and a connector terminal 124 which is electrically connected to the external terminal.

On the circuit substrate 120, the sensor 130 and the other electronic components (not shown) are mounted.

Moreover, functions, structures, and the like of the substrate main body 121, the printed wiring area 122, the motor terminal 123, and the connector terminal 124 are substantially the same as the substrate main body 21, the printed wiring area 22, the motor terminal 23, and the connector terminal 24 described in the first embodiment, and thus descriptions here are omitted.

The sensor 130 includes two Hall ICs 131 mounted on the circuit substrate 120, and two stators (not shown) formed by a magnetic material.

The two Hall ICs 131 are disposed between the two stators and embedded in a cylindrical part formed by resin. Here, the Hall IC 131 and the stator are formed by partial insert-molding relative to the circuit substrate 120. Moreover, the sensor 130 may not be obtained by the insert-molding, but may only be equipped with the Hall ICs 131 without using the stator.

Besides, the sensor 130 works together with an annular armature 163a and a pair of permanent magnets 163b embedded in a gear 163 which is linked to the throttle shaft 140, and the sensor 130 functions as a noncontact magmatic rotation sensor and detects the rotation position of the throttle shaft 140, that is, the degree of opening of the throttle valve 140a.

The motor 150 is a DC motor, and includes a cylindrical main body 151, a drive shaft 152, and a pin terminal 153 extending from the main body 151.

The pin terminal 153 is electrically connected to the motor terminal 123 arranged on the circuit substrate 120.

The speed reduction mechanism 160 includes a small gear 161 which is coupled to the drive shaft 152 of the motor 150, a two-stage gear 162, and the gear 163 which is linked to the throttle shaft 140.

The two-stage gear 162 integrally includes a large diameter gear which meshes with the small gear 161 and a small diameter gear which meshes with the gear 163.

According to the speed reduction mechanism 160, the rotational driving force of the motor 150 is transferred to the throttle shaft 140 via the small gear 161, the two-stage gear 162, and the gear 163.

The default mechanism 170 positions, in a state that the driving force of the motor 150 does not act, the throttle valve 140a between a fully closed position and a fully open position and in a default position having a degree of opening greater than an idle position.

According to the third embodiment, the connector terminal 124 is integrally formed as a part of the circuit substrate 120, and thus the conventional terminal conductor and the conventional wiring conductor are no longer required, and the reduction in the number of components, the reduction in cost and weight, the simplification of structure, and other effects can be achieved.

In addition, the housing 110 has the dual partitioning structure which consists of the cover 111 used as the first housing and the throttle body 112 used as the second housing, and thus the assembly of the circuit substrate 120 becomes easy, and the operation of disposing the connector terminal 124 in the connector 111d also becomes easy.

In the embodiment, the rotation sensors 30 and 130 are shown as sensors electrically connected to the circuit substrates 20 and 120, but the present invention is not limited hereto, and the sensors for detecting information of other objects to be measured may be arranged.

In the embodiment, only the sensor 130 for detecting the rotation position is shown as the sensor electrically connected to the circuit substrate 120, but the present invention is not limited hereto, and in addition to the sensor 130, a temperature sensor for detecting a temperature of the intake air flowing through the intake air passage, a pressure sensor for detecting pressure, or the like may be electrically connected.

In the embodiment, the noncontact sensors 30 and 130 are shown as the sensors electrically connected to the circuit substrate, but the present invention is not limited hereto, and a contact sensor may be used.

In the embodiment, the case where the circuit substrates 20 and 120 are fixed to the first housings 11, 101 and 111 by the screw b is shown, but the present invention is not limited hereto, and the circuit substrates 20 and 120 may be molded or embedded in the first housing.

In the embodiment, the case where the terminal wirings are arranged on both surfaces of the extension plates 21a and 121a which define the connector terminals 24 and 124 is shown, but the present invention is not limited hereto, and the terminal wirings may be arranged on one surface of the extension plates when there are a small number of the terminal wirings.

As described above, the detection device of the present invention can achieve the reduction in the number of components, the reduction in cost and weight, the simplification of structure, and other effects, and thus the detection device can certainly be applied as the detection device for detecting various information in an electronic instrument of an automobile, a two-wheeled vehicle, or the like, and is also useful as another device to which the detection device is assembled.

What is claimed is:

1. A detection device, comprising:
a housing;
a circuit substrate disposed in the housing;
a sensor which is electrically connected to the circuit substrate and detects information of a rotation shaft to be measured;
a motor which is disposed in the housing in order to exert a rotational driving force on the rotation shaft, wherein the circuit substrate comprises a motor terminal to which the motor is electrically connected;
a connector terminal which is formed integrally with the circuit substrate and electrically connected to an external terminal; and
a tubular connector which is formed integrally with the housing, surrounds a periphery of the connector terminal, and is fitted in the external connector,
wherein the circuit substrate comprises a substrate main body formed in a flat-plate shape, a printed wiring printed on a mounting surface of the substrate main body and the connector terminal, and
the connector terminal comprises an extension plate extending from an edge of the substrate main body, and a terminal wiring which is printed on the extension plate and forms a part of the printed wiring,
the housing comprises a partition member for partitioning an internal space in which the circuit substrate is disposed and a connector space in which the connector terminal is disposed, and
the extension plate is provided in the connector space and fitted in a female external connector,
the sensor comprises a rotation sensor for detecting a rotation position of the rotation shaft,
the rotation shaft which is supported to rotate freely relative to the housing, wherein the rotation sensor is disposed to detect the rotation position of the rotation shaft,
an axial line of the motor is disposed parallel to the mounting surface of the circuit substrate, and
an axial line of the rotation shaft is disposed perpendicular to the mounting surface of the circuit substrate.

2. The detection device according to claim 1, wherein the housing comprises a first housing fixing the circuit substrate, and a second housing which is coupled to the first housing so as to cover the circuit substrate.

3. The detection device according to claim 1, wherein the circuit substrate is fixed to the housing in the vicinity of a base area of the connector terminal.

4. The detection device according to claim 1, wherein the terminal wiring comprises a sensor terminal wiring corresponding to the sensor, and a motor terminal wiring corresponding to the motor.

5. The detection device according to claim 4, wherein the terminal wiring is arranged on one surface or two surfaces of the extension plate.

* * * * *